(12) United States Patent
Takayama

(10) Patent No.: US 6,330,053 B1
(45) Date of Patent: Dec. 11, 2001

(54) IMAGE ALIGNMENT METHOD IN CHECKING RETICLE PATTERN

(75) Inventor: Naohisa Takayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/386,362

(22) Filed: Aug. 31, 1999

(30) Foreign Application Priority Data

Aug. 31, 1998 (JP) .................................................. 10-245512
Dec. 18, 1998 (JP) .................................................. 10-360640

(51) Int. Cl.⁷ ............................. G03B 27/32; G03B 27/42
(52) U.S. Cl. ................................................. 355/77; 355/53
(58) Field of Search .......................... 355/53, 77; 430/22; 382/144, 145, 147, 148, 151; 356/237.1, 394, 396; 438/16; 716/5

(56) References Cited

U.S. PATENT DOCUMENTS

| | | | | |
|---|---|---|---|---|
| 4,218,142 | * | 8/1980 | Kryger et al. | 356/394 |
| 4,532,650 | * | 7/1985 | Wihl et al. | 382/144 |
| 4,556,317 | * | 12/1985 | Sandland et al. | 356/237.1 |
| 4,559,603 | * | 12/1985 | Yoshikawa | 364/491 |
| 4,618,938 | * | 10/1986 | Sandland et al. | 382/148 |
| 4,644,172 | * | 2/1987 | Sandland et al. | 250/548 |
| 4,783,826 | * | 11/1988 | Koso | 382/147 |
| 4,893,346 | * | 1/1990 | Bishop | 382/147 |
| 5,307,421 | * | 4/1994 | Darboux et al. | 382/145 |
| 5,744,381 | * | 4/1998 | Tabata et al. | 438/16 |
| 6,091,845 | * | 7/2000 | Pierrat et al. | 382/144 |

FOREIGN PATENT DOCUMENTS

| | | | |
|---|---|---|---|
| 03-170930 | * | 7/1991 | (JP) . |
| 4-295748 | | 10/1992 | (JP) . |
| 04-295748 | * | 10/1992 | (JP) . |
| 2720935 | | 11/1997 | (JP) . |

* cited by examiner

*Primary Examiner*—Russell Adams
*Assistant Examiner*—Rodney Fuller
(74) *Attorney, Agent, or Firm*—Foley & Lardner

(57) ABSTRACT

A check surface of a reticle is divided into a plurality of frames, and an optical image obtained from the reticle in frame units is compared with a reference image to check a pattern. To attain this, the optical image is aligned with the reference image before a check. At this time, an optical image is obtained in each frame, and a reference image for use in checking each frame is generated. Then, the optical image is aligned with the reference image by referring to the offset amount in the vicinal frame in which the aligning process has been performed. Otherwise, an offset amount table storing each of a plurality of areas obtained by dividing the movement range of a stage on a reticle, and a corresponding offset amount when the stage is in the area are generated. The optical image is aligned with the reference image by referring to the offset amount table.

11 Claims, 7 Drawing Sheets

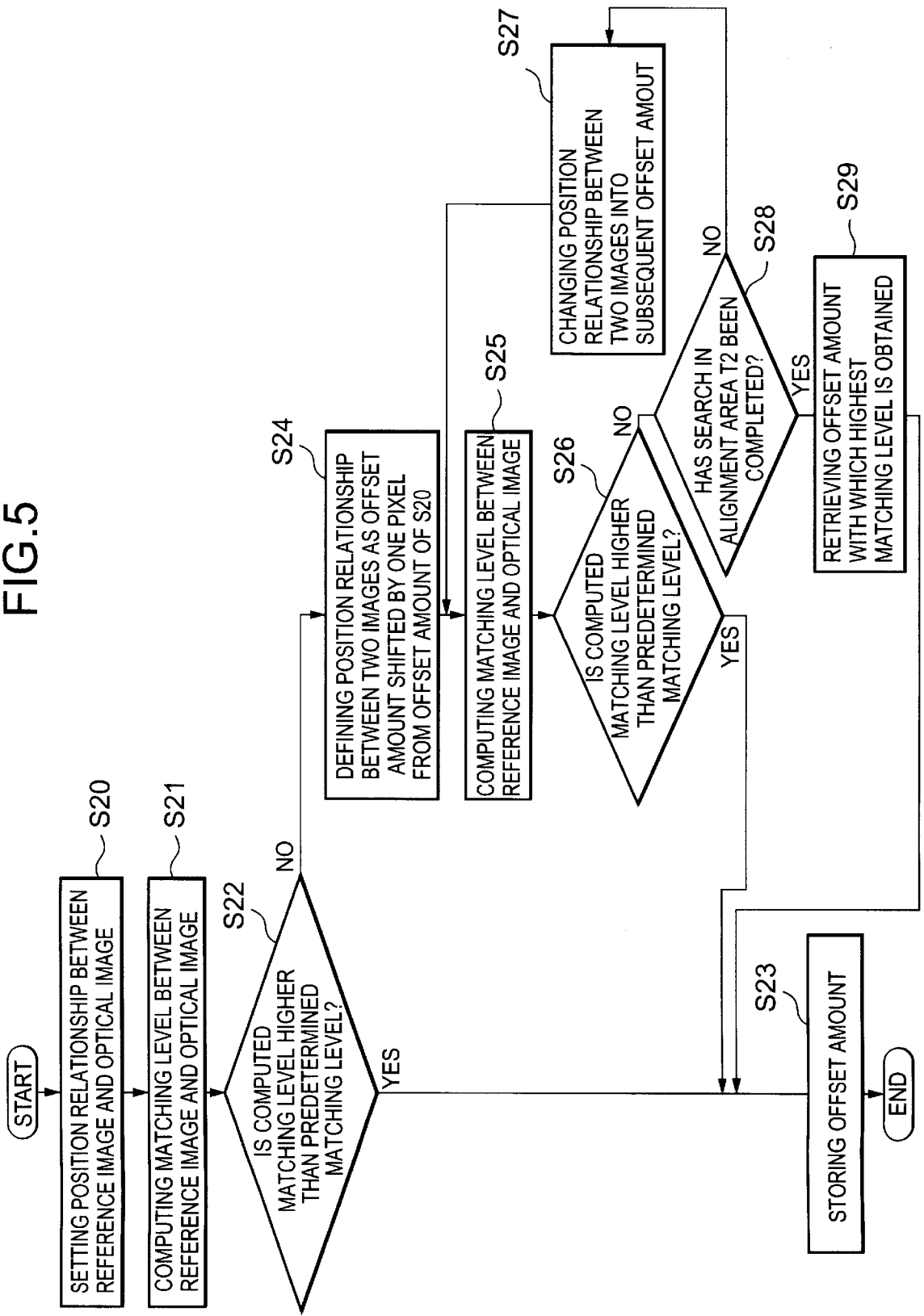

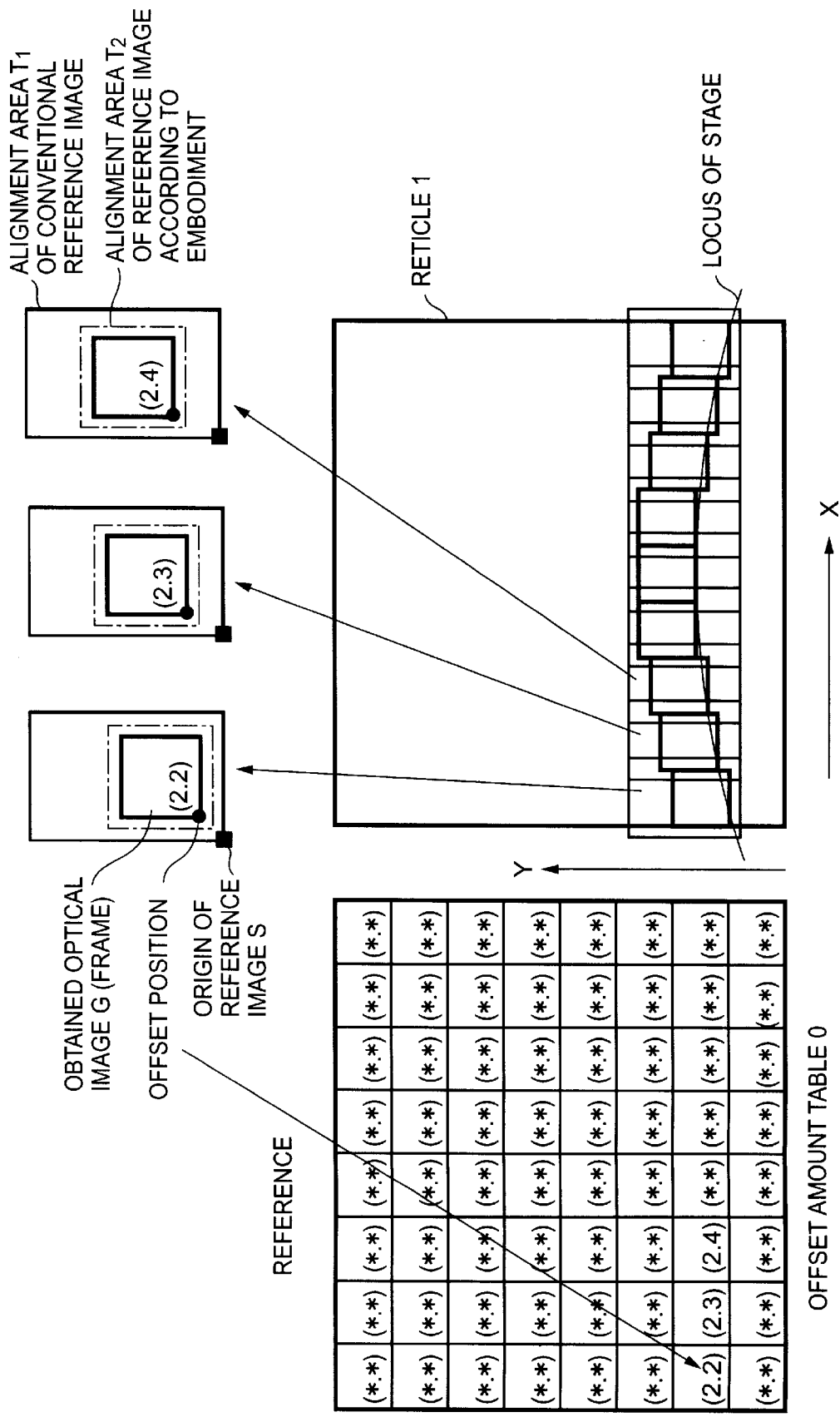

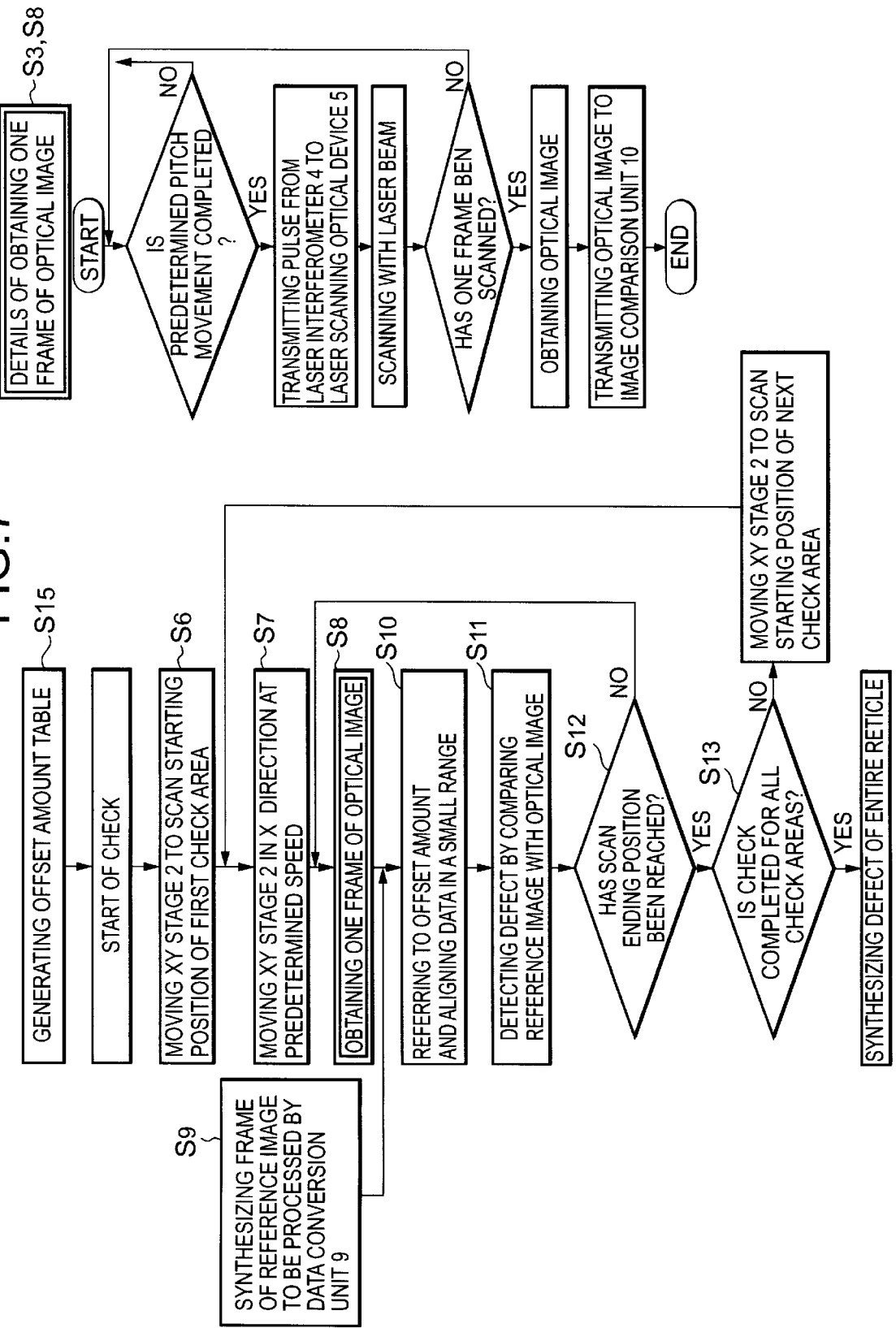

IMAGE ALIGNMENT METHOD IN CHECKING RETICLE PATTERN

BACKGROUND OF THE INVENTION

1. Field of the Invention

The present invention relates to an image alignment method in checking a pattern of a reticle, and more specifically to an image alignment method for aligning an obtained optical image of the reticle with a reference image to be referred to for checking the pattern of the reticle.

2. Description of the Related Art

A reticle is used to form a predetermined pattern on a semiconductor wafer made of silicone, etc. in an LSI manufacturing process (patterning).

When the pattern of a reticle is defective, the defective pattern of the reticle is transferred on the wafer, and a large volume of defective LSIs are produced. Therefore, it is important to check the pattern of a reticle.

The method for checking the pattern of the reticle for production of LSIs can be either a 'die to die check' made by comparing a pattern with the same pattern at a different portion on the same reticle, or a 'die to database check' made by comparing the pattern of a reticle with CAD data used when the pattern of the reticle is drawn. The 'die to die check' method is disclosed in Japanese Patent Laid-Open No. 4-295748, for example. The 'die to database check' method is disclosed in Patent Official Gazette No. 2720935, etc.

A 'Die' refers to a pattern area that is a unit for comparison and check of an image pattern, or a detected image. A 'database' refers to a reference image synthesized from drawing CAD data in comparison with an optically detected actual pattern image.

In the checking method using a checking device, the check area of a reticle 1 is divided into a plurality of check areas having overlapping portions in the Y direction as shown in FIG. 2. The check areas are sequentially checked, and the defects of all check areas are finally integrated to detect the entire defect of the reticle.

In checking each check area, an XY stage provided with a reticle is first moved to the check starting position.

Then, while moving the XY stage at a constant speed in the X direction, a laser scanning optical device emits a laser beam in the Y direction each time a laser interferometer detects a movement at a predetermined pitch. Then, a transmitted light is detected, and a two-dimensional image is obtained for each frame. The optical image is compared with a reference image synthesized by an image comparison unit to detect a defect. The 'frame' refers to a unit of images that can be processed at a time.

When an optical image is obtained using a reticle pattern checking device, the XY stage is moved in the X direction, and the optical image G is sequentially obtained in frame units from the left end to the right end of the reticle 1. However, when the locus of the moving XY stage is curved by an orthogonal error or a mobile line error, and when an optical image obtained in frame units is synthesized, the synthesized image is obtained as curved along the curved locus.

Therefore, the obtained optical image G shows a position shift from the reference image S, and it is necessary to make alignment before comparing images.

However, in the conventional method, a reference alignment is set in a range larger than the obtained optical image G in consideration of the range of the largest possible XY stage error. The obtained optical image G is moved in sub-pixel units within a set range of an alignment area T1. A matching level is obtained between the obtained optical reference image G and the reference image S. According to the common method, the reference image S is compared with the optical reference image G obtained at the highest matching level.

The problem of this method is that the larger the error of the XY stage is, the wider the range in which an optical image is moved becomes. Thereby, the alignment processing time and the checking time on the entire reticle is prolonged.

SUMMARY OF THE INVENTION

The present invention aims at shortening the time required for alignment, and remarkably shortening a total checking time, thereby improving the productivity of a reticle.

To attain the above-described objects, the image alignment method for use in checking the pattern of a reticle according to the present invention, in which a check surface of the reticle is divided into a plurality of frames, and an optical image obtained from the reticle for each frame is aligned with a reference image for comparison with the reticle in checking a pattern, obtains an optical image of each frame, generates a reference image for check of each frame, refers to an offset amount in a frame in the vicinity of the alignment, and aligns the optical image with the reference image.

According to the present invention, since the optical image is aligned by referring to an offset amount in the frame near the already aligned frame, the images can be aligned in a small area. Therefore, the image aligning time can be shortened, and the time required checking a defect of a reticle can be remarkably shortened. In addition, the aligning time is not prolonged even if the absolute error of a stage is large. Therefore, the standard of the XY stage for which very high precision has conventionally been demanded can be moderated, thereby reducing the cost of the entire system.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 5 shows the alignment between the reference image and the optical image in step S10 shown in FIG. 4;

FIG. 6 shows the image alignment method in checking the pattern of a reticle according to the second embodiment of the present invention; and FIG. 7 is a flowchart of the image alignment method in checking the pattern of a reticle according to the second embodiment of the present invention.

DETAILED DESCRIPTION OF THE PREFERRED EMBODIMENT

The embodiments of the present invention are described below by referring to the attached drawings.

(First Embodiment)

Figure 1:
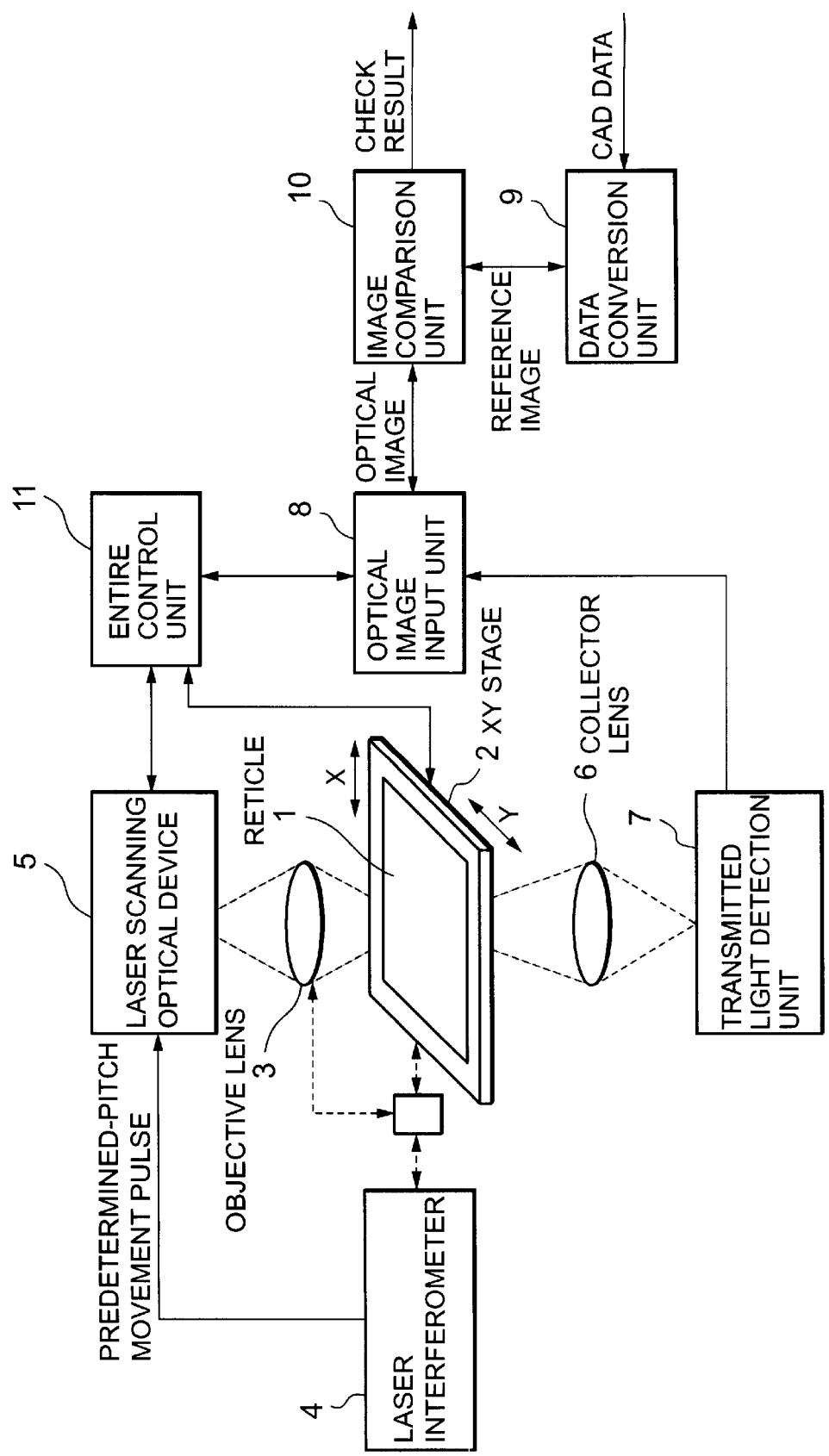
FIG. 1 shows the configuration of the apparatus embodying the image alignment method in checking the pattern of a reticle according to an embodiment of the present invention.

FIG. 1 shows the configuration of the apparatus for checking the reticle pattern according to the first embodiment of the present invention.

In FIG. 1, the apparatus for checking the reticle pattern according to the first embodiment of the present invention comprises an XY stage 2, an objective lens 3, a laser interferometer 4, a laser scanning optical device 5, a collector lens 6, a transmitted light detection unit 7, an optical image input unit 8, a data conversion unit 9, an image comparison unit 10, and an entire control unit 11.

The XY stage 2 is provided with the reticle 1, and can be moved in the directions of two orthogonal axes.

The objective lens 3 is designed to collect a laser beam output from the laser scanning optical device 5, and emit it to the reticle 1.

The laser interferometer 4 detects with high precision a relative position of the XY stage 2 in the X direction for the objective lens 3.

The laser scanning optical device 5 scans the reticle 1 provided for the XY stage 2 with a laser beam in the Y direction.

The collector lens 6 collects a light transmitted through the reticle 1.

The transmitted light detection unit 7 detects the transmitted light collected by the collector lens 6.

The optical image input unit 8 obtains an optical image G of the reticle 1 from the transmitted light detected by the transmitted light detection unit 7.

The data conversion unit 9 converts CAD data used in drawing a pattern when the reticle 1 is produced into a reference image S.

The image comparison unit 10 divides the check surface of the reticle 1 into a plurality of check areas in the Y direction, and divides it into a plurality of frames in the X direction. The optical image G is output from the optical image input unit 8 for each frame of the check area. The image comparison unit 10 compares the optical image G with the reference image S output from the data conversion unit 9, thereby detecting a defect of a pattern. When the optical image G is compared with the reference image S in frame units, images are aligned at the subsequent frames by referring to the offset amount in the alignment of the preceding frames.

The entire control unit 11 generally controls the above-described components.

Then, the image alignment method according to the first embodiment of the present invention using the device shown in FIG. 1 is described by referring to FIGS. 1 through 4.

Figure 2:
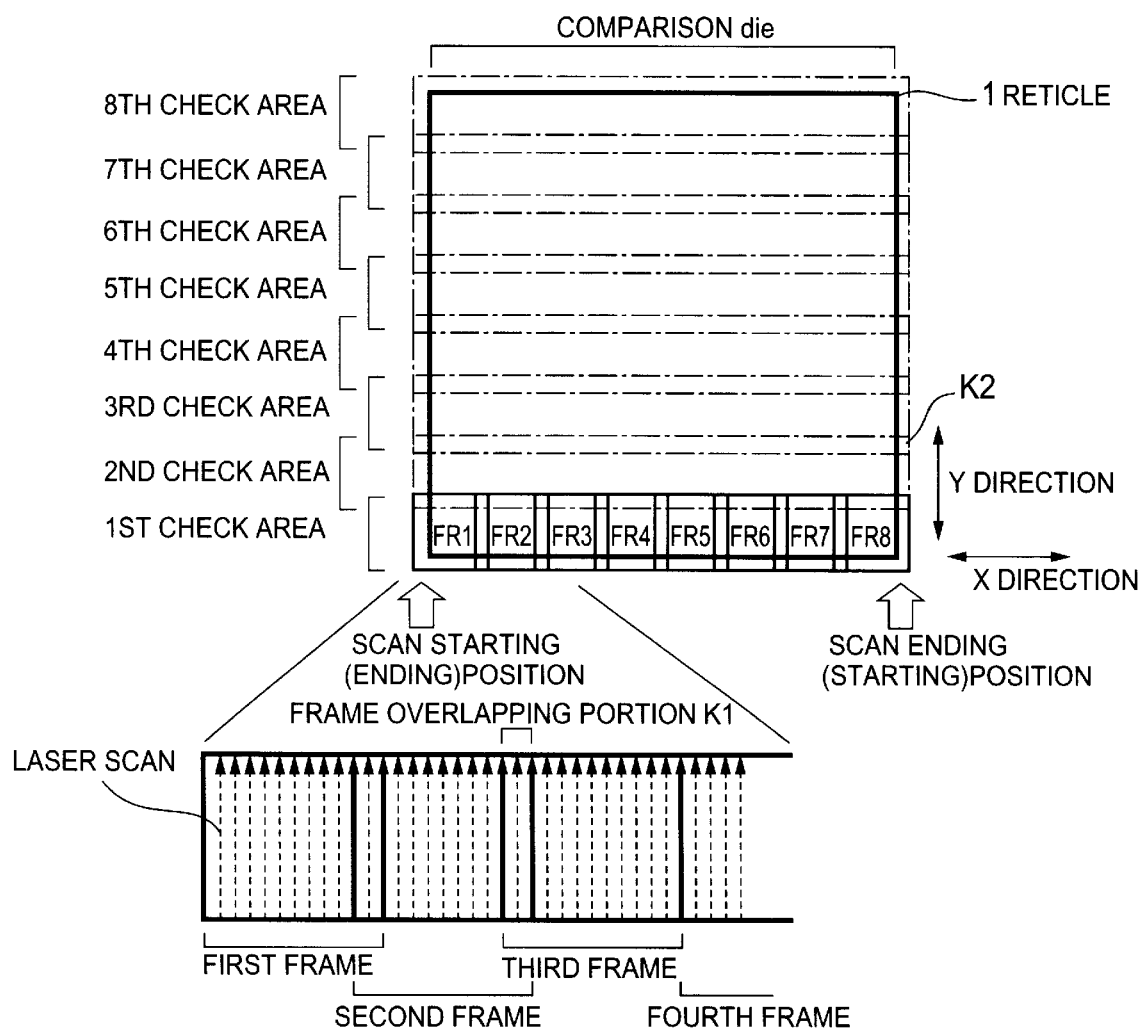
FIG. 2 shows the concept of 'die to database check'.

FIG. 2 shows the concept of the 'die to database check'. In FIG. 2, the check area of the reticle 1 is divided into a plurality of check areas having the overlapping portion K2 in the Y direction. In FIG. 2, it is divided into eight areas, that is, the first check area through the eighth check area.

Furthermore, each check area of the reticle 1 is divided into a plurality of frames having the overlapping portion K1 in the X direction. In FIG. 2, it is divided into eight frames, that is, the first frame FR1 through the eighth frame FR8.

At a stage before starting a check, the data conversion unit 9 obtains the CAD data used when the reticle 1 to be checked was produced. The data conversion unit 9 generates, for each check area based on the data, intermediate data for use in synthesizing the reference image S. Practically, for example, when the CAD data is different from the data of the pattern-checking device in resolving power, the data is converted into the data having the resolving power of the pattern-checking device. In addition, a plurality of data files corresponding to each frame are generated, and data is allotted to corresponding data files based on the drawing position of each graphic element contained in the CAD data. At this time, it is checked whether each graphic element is spread over a plurality of frames. If so, CAD data for partial graphics for each frame is generated, and stored in each file. Furthermore, the data format of the CAD data is inconvenient when the pattern-checking device quickly generates an image at a high speed. Thus, the process by the data conversion unit 9 is required also to change data into the data format convenient to synthesize the reference image S in a short time during the checking process.

Before starting an actual check, an optical image G in the first frame FR1 positioned in the first check area is obtained to measure the first offset amount. The first offset amount is the relative position information about the origin of the obtained optical image to the origin of the reference image at the position of the highest matching level).

Figure 4:
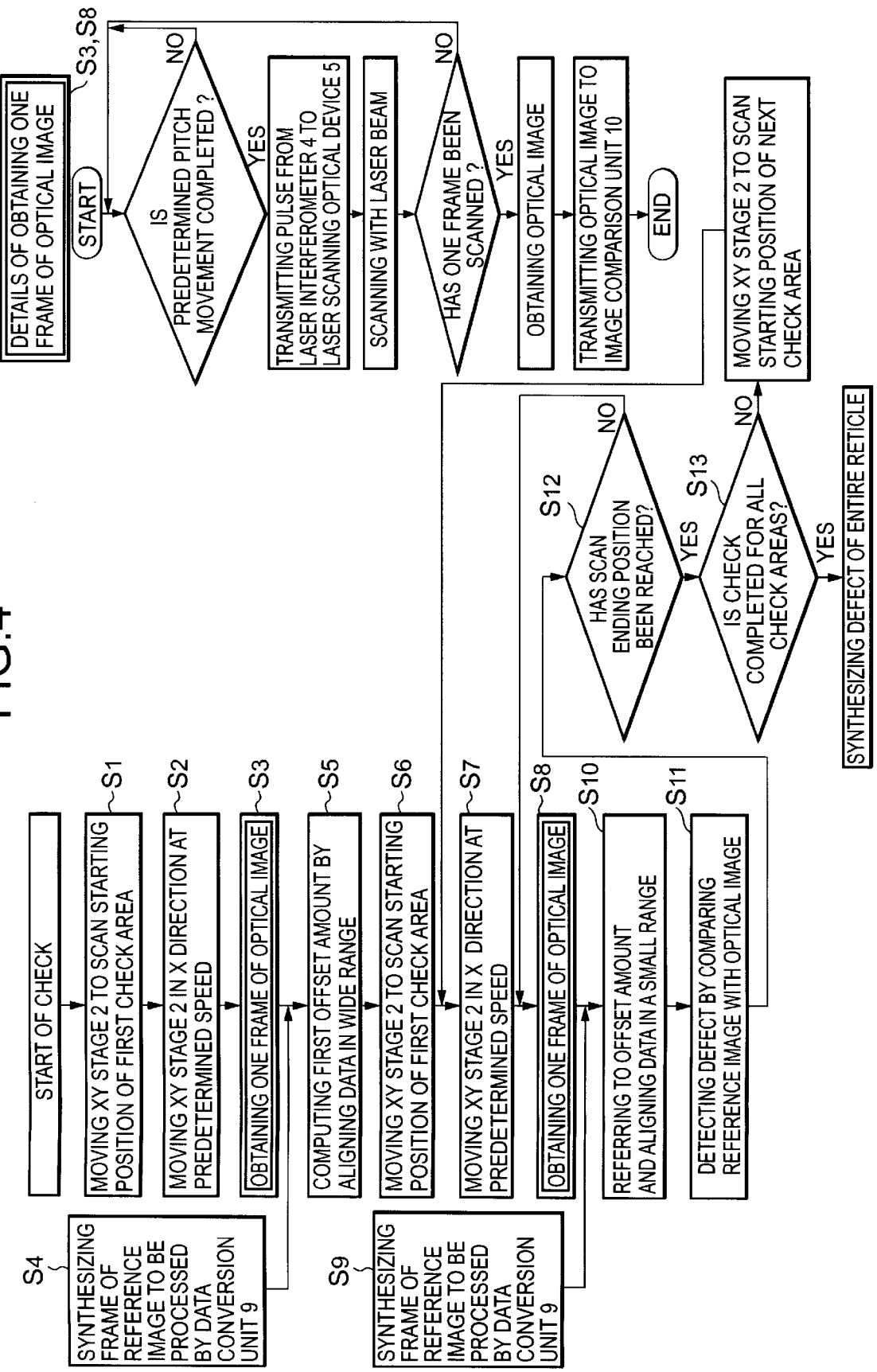
FIG. 4 is a flowchart of the image alignment method in checking the pattern of a reticle according to the first embodiment of the present invention.

Practically, the XY stage 2 provided with the reticle 1 is moved to the starting position (on the left of the reticle 1) of the scanning process on the first frame FR1 side (step Si shown in FIG. 4). The XY stage 2 is moved in the X direction of the first frame FR1 at a constant speed (step S2 shown in FIG. 4).

The laser interferometer 4 transmits a predetermined-pitch movement pulse to the laser scanning optical device 5 each time the relative position of the objective lens 3 and the XY stage 2 in the X direction moves a predetermined pitch (for example, 0.1 $\mu$m) in the first frame FR1.

Then, each time the relative positions of the objective lens 3 and the XY stage 2 in the X direction move a predetermined pitch in the first frame FR1, the laser scanning optical device 5 receives a predetermined-pitch movement pulse from the laser interferometer 4. Further, the laser scanning optical device 5 scans data at the rise time of the pulse with a laser beam in the Y direction indicated by the arrow shown in FIG. 2 (laser scanning).

The scanning laser beam output from the laser scanning optical device 5 is emitted to the reticle 1 through the objective lens 3. The transmitted light is collected by the collector lens 6 and detected by the transmitted light detection unit 7.

The laser scanning process is repeated by the laser scanning optical device 5 at each predetermined pitch. The results are sequentially transferred to the optical image input unit 8, and an optical image G is obtained as a two-dimensional image of one frame (step S3 shown in FIG. 4). The optical image G obtained by the optical image input unit 8 is output to the image comparison unit 10.

On the other hand, the data conversion unit 9 synthesizes from developed intermediate data a reference image S of one frame to be processed (step S4 shown in FIG. 4), and outputs the data to the image comparison unit 10.

The image comparison unit 10 aligns the obtained optical image G of one frame with the reference image S synthesized by the data conversion unit 9 in a wide range. Then, the first offset amount is computed (step S5 shown in FIG. 4), and is stored.

At this time, the range in which the optical image G is moved is a wide range set with the largest possible error of the XY stage 2 taken into account.

Practically, it is set based on the allowable error and the system of the XY stage. When the allowable error is, for example, 1 μm, and when the precision of the XY stage is, for example, 10 μm of linearity for the movement of 100 mm, the optical image G is moved within a range of 10 μm square. At this time, for example, the optical image G is moved by the distance of 10 μm at each predetermined pitch (for example 0.1 μm) in the X direction. Then, the optical image G is moved at a predetermined pitch in the Y direction. Then, it is moved in the reverse direction along the X direction by a predetermined pitch. Each time the optical image G is moved by the predetermined pitch, it is compared with the reference image S, and the matching level is computed. After the optical image G is moved within the predetermined area, the position at the highest matching level is defined as the first offset amount, thereby terminating the aligning process. The above position is relative position of the origin of the obtained optical image to the origin of the reference image. The matching level is, for example, the value indicating the rate of the data detected both picture elements in the optical image G and picture element in the reference image S.

As described above, when the first offset amount is completely measured, an actual check starts.

First, the XY stage 2 provided with the reticle 1 is moved to the scanning start position of the first check area. In the first embodiment, the scanning start position is leftmost position on the first frame FR1 side of the first check-area according to the first embodiment (step S6 in FIG. 4). Then, the XY stage 2 is moved at a predetermined speed in the X direction on the first frame FR1 (step S7 in FIG. 4).

When the XY stage 2 is moved at a predetermined speed, the laser interferometer 4 transmits a predetermined-pitch movement pulse to the laser scanning optical device 5 each time the relative position of the objective lens 3 and the XY stage 2 in the X direction moves a predetermined pitch (for example, 0.1 μm) in each of the frames FR1 through FR8.

The laser scanning optical device 5 scans data with the laser beam in the Y direction indicated by the arrow shown in FIG. 2 in each of the frames FR1 through FR8 at each rise time of the predetermined-pitch movement pulse from the laser interferometer 4.

Then, the optical image input unit 8 obtains an optical image G from the transmitted light detected by the transmitted light detection unit 7. In this case, the optical image G is obtained in frame units of the first frame FR1 through the eighth frame FR8 obtained by dividing the first check area in the X direction (step S8 in FIG. 4).

Then, the optical image G obtained by the optical image input unit 8 is sequentially output to the image comparison unit 10.

Figure 3:
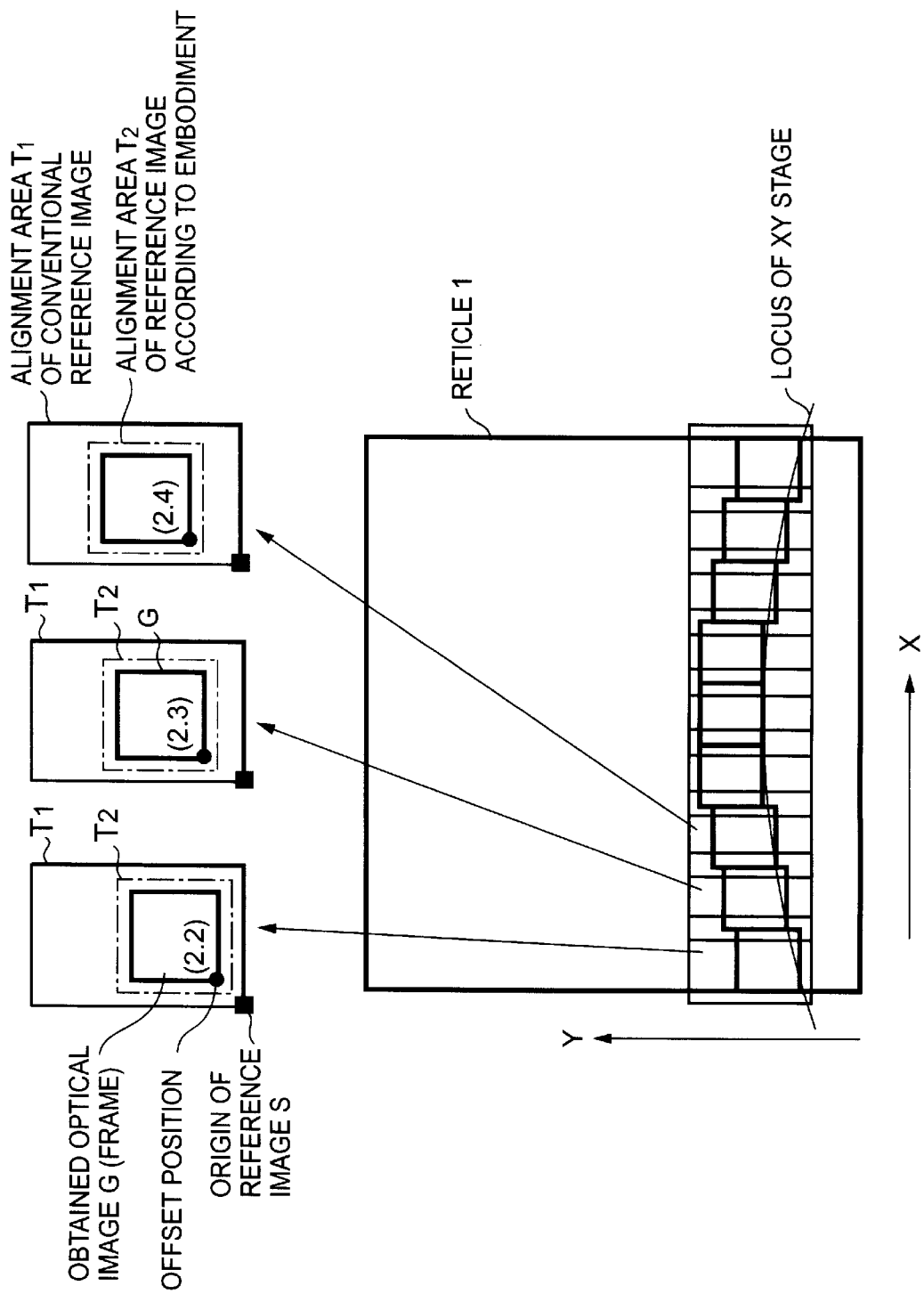
FIG. 3 shows the image alignment method in checking the pattern of a reticle according to the first embodiment of the present invention.

On the other hand, the data conversion unit 9 synthesizes the reference image S in real time for each frame of the first frame FR1 through the eighth frame FR8 from the developed intermediate data (step S9 in FIG. 4). Then, the data conversion unit 9 sequentially transmits the image to the image comparison unit 10. As shown in FIG. 3, the image comparison unit 10 compares and aligns the optical image G obtained by the optical image input unit 8 with the reference image S in real time (step S10 shown in FIG. 4).

It aligns the reference image S in the first frame FR1 with the obtained optical image G. In this case, after measuring the first offset amount prior to the check, the relative origin's position of the obtained optical image to the reference image is set. This setting is performed by referring to the offset amount in the already aligned near frame (step S20 shown in FIG. 5). In the first frame FR1, it is set to the first offset amount obtained in step S5. The first offset amount is relative position information about the origin of the obtained optical image to the origin of the reference image at the position of the highest matching level as described above. With the position relationship, the reference image S is compared with the obtained optical image G to compute the matching level (step S21 shown in FIG. 5). It is determined whether or not a predetermined matching level has been obtained with the position relationship (step S22 shown in FIG. 5). If yes, the offset amount is stored as an offset amount in the corresponding frame (step S23 in FIG. 5), thereby terminating the aligning process. If not, the relative position of the origin of the obtained optical image to the origin of the reference image is set to one of the eight offset amounts obtained by shifting by one pixel of the obtained optical image in the X and Y directions from the offset amount set in step S20 (step S24 shown in FIG. 5). With the position relationship, the reference image S is compared with the obtained optical image G to compute the matching level (step S25 shown in FIG. 5). It is determined whether or not a predetermined matching level has been obtained with the position relationship (step S26 shown in FIG. 5). If yes, the offset amount is stored as an offset amount in the corresponding frame (step S23 in FIG. 5), thereby terminating the aligning process. If not, it is further determined whether or not the search in a predetermined alignment range T2 has been completed (step S28 shown in FIG. 5). If not, the relative position of the origin of the obtained optical image to the origin of the step reference image is changed into the subsequent offset amount (step S27 shown in FIG. 5), then returning to step S25. If a predetermined matching level is not obtained for any of the above-described eight offset amounts, then it is set to one of the 16 offset amounts obtained by shifting by two pixels the optical image obtained in the X and Y directions from the initial offset amount in step S27. Then, the processes in steps S25 and S26 are performed on each offset amount to obtain and store an offset amount with which a predetermined matching level can be obtained. If the searching process has been completed in a predetermined alignment range T2 without a predetermined matching level, then an offset amount with which the highest matching level has been obtained in the area is retrieved and stored.

Thus, since the alignment between the reference image S and the obtained optical image G is started in frame units from the offset position in the vicinal frame, according to the present embodiment, the optical image G is moved in the small alignment area T2 enclosed by the dash-and-point lines in the reference image S as shown in FIG. 3. Therefore, the moving area of optical image G for the alignment is smaller than the conventional alignment area T1 (matching the reference image S) indicated by the dotted lines, thereby shortening the aligning time.

When the aligning process is completely performed on the first frame FR1, the image comparison unit 10 compares the optical image G obtained by the optical image input unit 8 with the reference image S synthesized by the data conversion unit 9, and detects a defect (step S11 shown in FIG. 4). Furthermore, at this time, the image comparison unit 10 computes the offset amount (2, 2) in the first frame FR1, and updates the offset amount to perform the aligning process on the second frame FR2.

In the second frame FR2, the reference image S is aligned with the obtained optical image G by referring to the offset amount (for example, (2, 2)) of the updated first frame FR1.

In the second frame FR2, the reference image S is aligned with the obtained optical image G by referring to the offset amount (2, 2) of the first frame FR1. Therefore, the optical image G is moved in the small alignment area T2 enclosed by the dash-and-point lines in the reference image S as shown in FIG. 3.

In this case, the offset amount of one frame before the current frame is referred to. However, in a range of a small stage (for example, between adjacent frames), the error (generally an orthogonal error and a mobile line error) in the XY stage 2 is very small. Accordingly, the difference between the offset amount between the current frame and one frame before the current frame is also small.

Therefore, it is certain that the offset amount (position of the highest matching level) in the current frame is close to the offset amount of the frame immediately before the current frame. Therefore, an aligning process can be performed in a small alignment area by referring to the offset amount of the frame immediately before the current frame.

When the aligning process between the reference image S and the obtained optical image G is completed in the second frame FR2, the offset amount of the obtained optical image G is computed in the second frame FR2. However, for the above-described reason, the offset amount in the second frame FR2 is close to the offset amount (2, 2) in the first frame FR1, and is, for example, the offset amount (2, 3). Furthermore, the image comparison unit 10 computes the offset amount (2, 3) of the second frame FR2 when the aligning process between the reference image S and the obtained optical image G is completed in the second frame FR2, and simultaneously updates the offset amount to perform the aligning process on the third frame FR3.

Therefore, when the aligning process is performed between the reference image S and the obtained optical image G in the second frame FR2, the range (alignment range T2) in which the optical image G is moved can be small, thereby shortening the aligning time.

When the scanning process goes on as shown in FIG. 2, and the XY stage 2 reaches the scan ending position (rightmost position of the stage 1), the XY stage 2 is moved in the Y direction by a predetermined distance toward the succeeding second check area (step S12 shown in FIG. 4).

In this case, the XY stage 2 is moved at a predetermined speed in the reverse direction along the X axis (from right to left in FIG. 2), and the process of obtaining an optical image in the second check area is started while performing the aligning process as described above.

This operation is repeatedly performed to the last check area (the eighth check area according to the first embodiment) to complete the check on the entire reticle (step S13 shown in FIG. 4)

When the check is completed on all check areas of the reticle 1, the image comparison unit 10 synthesizes and outputs the defect of the entire reticle based on the defect check result of each check area (step S14 shown in FIG. 4).

An example of the offset amount is shown in FIG. 3, but the offset amount is not limited to this example.

According to the embodiment of the present invention shown in FIG. 1, the laser scanning optical device 5 is combined with the transmitted light detection unit 7. However, a mercury lamp can replace the laser scanning optical device 5, a CCD line sensor can replace the transmitted light detection unit 7, and these combination can obtain the optical image G.

As described above, according to the first embodiment of the present invention, an aligning process can be performed on a small area by referring to the offset amount in the previous frame. Therefore, the time taken for alignment is not prolonged even if an absolute error in a stage is large, thereby shortening the image aligning time, and remarkably shortening the time taken for checking the defect in a reticle.

Furthermore, since the aligning time is not prolonged even when an absolute error in a stage is large, thereby moderating the standard of the XY stage for which very high precision has conventionally been demanded, and reducing the cost of the entire system.

(Second Embodiment)

FIG. 6 shows the image alignment method in checking the pattern of a reticle according to the second embodiment of the present invention. FIG. 7 is a flowchart of the image alignment method in checking the pattern of a reticle according to the second embodiment of the present invention.

As with the first embodiment of the present invention shown in FIG. 1, the reticle pattern checking device according to the second embodiment of the present invention shown in FIGS. 6 and 7 comprises the XY stage 2 for setting the reticle 1, the objective lens 3 for collecting a laser beam and emitting it to the reticle 1, the laser interferometer 4 for detecting the relative position between the objective lens 3 and the XY stage 2 in the X direction with high precision, the laser scanning optical device 5 for scanning data in the Y direction with a laser beam, the collector lens 6 for collecting a transmitted light, the transmitted light detection unit 7 for detecting the transmitted light collected by the collector lens 6, the optical image input unit 8 for obtaining an optical image from the transmitted light detection unit 7, the data conversion unit 9 for converting the CAD data used when the reticle is drawn into a reference image, the image comparison unit 10 for comparing an optical image with a reference image to detect a defect of a pattern, and the entire control unit 11 for controlling the entire device.

First, when a device assembly process is completed, a stage position shift amount table is produced.

Normally, the XY stage 2 generates an orthogonal error, mobile line error, etc. due to the poor precision in producing and mounting processes for the mechanism and the reproducibility thereof is very high.

Therefore, the stage movement range of the reticle 1 is divided into appropriate areas, and a position shift is measured in each area. As a result, the position of the stage can be obtained by determining to which area an obtained frame belongs, and the position shift at the obtained position can be informed of in advance.

The size of the area depends on the production precision of a stage, but is set such that the position error in the area can be within a predetermined value (for example, one pixel).

In the reticle pattern checking method according to the second embodiment of the present invention, the entire check area is divided into a plurality of check areas having an overlapping portion K1 with its longer side in the X direction, for example, as shown in FIG. 2 (the first check area through the eighth check area shown in FIG. 2), the check areas are sequentially checked, and finally the defects of the check areas are integrated to detect the defects of the entire reticle.

The checking method according to the second embodiment of the present invention is described below in detail by referring to FIGS. 1, 2, 6, and 7.

Before starting the checking process, the first offset amount is computed by performing the processes in steps S1 through S5 in the first embodiment, and the offset amount table O is generated by referring to the stage position shift amount table according to the first embodiment (step S15 shown in FIG. 7). The offset amount table O stores the position of a stage and the preliminarily measured offset amount corresponding to the position.

The data conversion unit 9 obtains the CAD data used when the reticle 1 to be checked was produced, and generates based on the data the intermediate data to synthesize a partial reference image in the range of each check area (step S9 in FIG. 7).

This process is necessary when a reference image S is synthesized within a short time during the checking process as described above. Successively, an actual check starts.

The XY stage 2 provided with the reticle 1 is moved to the check starting position (step S6 shown in FIG. 7), and the XY stage 2 is moved in the X direction at a predetermined speed (step S7 shown in FIG. 7).

The laser interferometer 4 transmits a predetermined-pitch movement pulse to the laser scanning optical device 5 each time the relative position of the objective lens 3 and the stage 2 in the X direction moves a predetermined pitch (for example, 0.1 m)

The laser scanning optical device 5 scans data in the Y direction with a laser beam at each rise time of the pulse.

The scanning laser beam is emitted to the reticle 1 through the objective lens 3, and a transmitted light is collected by the collector lens 6, and detected by the transmitted light detection unit 7. This scanning process is repeatedly performed at each predetermined pitch to obtain a 1-frame two-dimensional optical image G (step S8 shown in FIG. 7), and transfer it to the optical image input unit 8.

The optical image transferred to the optical image input unit 8 is sequentially received by the image comparison unit 10.

On the other hand, the data conversion unit 9 synthesizes a reference image for each frame from the developed intermediate data in real time, and sequentially transmits it to the image comparison unit 10.

The image comparison unit 10 first performs an aligning process as in the first embodiment to compare an optical image with a reference image in frame units (step S10 shown in FIG. 7). At this time, in step S20 shown in FIG. 5, the process is performed by referring to the offset amount table in the area in which the frame is located. Therefore, since the aligning process can be started on each frame using an offset amount with the precision of the stage taken into account, the range of moving a set optical image can be made smaller than in the first embodiment, thereby shortening the aligning time.

When the aligning process is completed, the optical image is compared with the reference image, and a defect is detected (step S11 shown in FIG. 7).

In the succeeding frame, the aligning process can be similarly performed by referring to the offset amount table for an area in which the frame is located. Therefore, the aligning time can be obviously shortened.

When the scanning process goes on, and the XY stage 2 reaches the scan ending position (step S12 shown in FIG. 7), the XY stage is moved in the Y direction to the next check area by a predetermined distance (step S13 shown in FIG. 7).

This time, the stage is moved in the reverse direction along the X axis at a predetermined speed, and an optical image of the next check area is obtained.

This operation is repeated until the last check area, thereby completing the checking process on the entire reticle. When the checking process is completed, the defect check results of all frames are integrated and the result about the entire area is output by the image comparison unit 10 (step S14 shown in FIG. 7).

As described above, according to the second embodiment of the present invention, not only the effect obtained in the first embodiment can be obtained, but also the image aligning time can be shortened by preparing a stage offset amount table O before checking the first frame (refer to FIG. 6), thereby remarkably shortening the time taken for checking one reticle.

Furthermore, a reference image for use in drawing the reticle is synthesized from CAD data, but other data can also be used.

What is claimed is:

1. An image alignment method in checking a pattern of a reticle, comprising the steps of:

obtaining an optical image from the reticle in each frame obtained by dividing a check surface of said reticle into a plurality of frames;

generating a reference image to be compared with said optical image in checking a pattern of said frame; and aligning said optical image with said reference image by referring to a positional shift offset amount in a vicinal frame in which an aligning process has been already performed.

2. The image alignment method according to claim 1, further comprising the steps of:

obtaining an optical image of a predetermined frame before aligning step for a first frame to be checked;

generating a reference image corresponding to said predetermined frame;

aligning said optical image of said predetermined frame with said reference image corresponding to said predetermined frame; and computing a first positional shift offset amount for use in aligning step for said first frame.

3. The image alignment method according to claim 1, further comprising the step of generating intermediate data from CAD data for each frame for use in generating a reference image for each frame before aligning step for a first frame to be checked.

4. The image alignment method according to claim 1, wherein said aligning step comprises the sub-steps of:

comparing said optical image with said reference image using said positional shift offset amount obtained in said vicinal frame;

determining whether or not a predetermined matching level has been obtained;

defining said positional shift offset amount obtained in said vicinal frame as an offset amount in a current frame when said predetermined matching level is obtained;

determining whether or not said predetermined matching level has been obtained by sequentially comparing said optical image with said reference image using each of a plurality of positional shift offset amounts obtained at one pixel shifted from said positional shift offset amount in said vicinal frame when said predetermined matching level is not obtained; and when said predetermined matching level is obtained with one of said positional shift offset amounts obtained at one pixel shifted from said positional shift offset amount in said vicinal frame, defining said one of said positional shift offset amounts as positional shift offset amount in a current frame.

5. The image alignment method according to claim 3, wherein
said step of generating said intermediate data for each frame comprising the sub-steps of:
checking whether or not each graphic element contained in said CAD data is spread over a plurality of frames; and
generating said CAD data for partial graphics to be drawn in each frame when the element is spread over a plurality of frames, and storing said CAD data for said partial graphics in a file of said intermediate data for each frame.

6. The image alignment method according to claim 3, wherein
said step of generating said intermediate data for each frame comprises the step of changing a data format of said CAD data into a data format convenient for synthesis of a reference image in a short time.

7. An image alignment method in checking a pattern of a reticle, comprising the steps of:
generating a positional shift offset amount table storing each of a plurality of areas obtained by dividing a moving range of a stage for moving the reticle, and a corresponding positional shift offset amount when said stage is located in each area;
obtaining an optical image from the reticle in each frame obtained by dividing a check surface of said reticle into a plurality of frames;
generating a reference image to be compared with said optical image in checking a pattern of said frame; and
aligning said optical image with said reference image by referring to said positional shift offset amount table.

8. The image alignment method according to claim 7, wherein said step of generating said positional shift offset amount table comprises the steps of:
obtaining an optical image of a first frame after setting the reticle on the stage;
generating a reference image for checking said first frame;
aligning said optical image of said first frame with said reference image for checking said first frame; and
computing a first positional shift offset amount in said first frame,
wherein the positional shift offset amount corresponding to each of said plurality of areas is obtained by referring to said first positional shift offset amount.

9. The image alignment method according to claim 7, wherein
said positional shift offset amount table stores a positional shift offset amount in each area corresponding to an area set such that a positioning error in each area can be within one pixel of an obtained optical image based on stage production precision.

10. A method for checking a pattern of a reticle, comprising the steps of:
obtaining an optical image from the reticle in each frame obtained by dividing a check surface of said reticle into a plurality of frames;
generating a reference image to be compared with said optical image in checking a pattern of said frame;
aligning said optical image with said reference image by referring to a positional shift offset amount in a vicinal frame in which an aligning step has been performed;
comparing said optical image with said reference image to detect a defect in each frame; and
synthesizing and outputting a defect of all areas of said reticle based on a defect check result of each frame when checking all frames of said reticle is completed.

11. A method for checking a pattern of a reticle, comprising the steps of:
generating a positional offset amount table storing each of a plurality of areas obtained by dividing a moving range of a stage for moving said reticle, and a corresponding positional shift offset amount when said stage is located in each area;
obtaining an optical image from a reticle in each frame obtained by dividing a check surface of said reticle into a plurality of frames;
generating a reference image to be compared with said optical image in checking a pattern of said frame;
aligning said positional shift optical image with said reference image by referring to said offset amount table;
comparing said optical image with said reference image to detect a defect in each frame; and
synthesizing and outputting a defect of all areas of the reticle based on a defect check result of each frame when checking all frames of said reticles is completed.

* * * * *